(12) United States Patent
Honda et al.

(10) Patent No.: US 7,005,660 B2
(45) Date of Patent: Feb. 28, 2006

(54) SURFACE PROCESSING APPARATUS

(75) Inventors: Minoru Honda, Nirasaki (JP); Ryo Nonaka, Nirasaki (JP); Kazuyuki Mitsuoka, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/836,265

(22) Filed: May 3, 2004

(65) Prior Publication Data
US 2004/0222388 A1 Nov. 11, 2004

(30) Foreign Application Priority Data
May 6, 2003 (JP) .............................. 2003-128303

(51) Int. Cl.
*H01J 37/30* (2006.01)

(52) U.S. Cl. .................................................. 250/492.3

(58) Field of Classification Search ............. 250/492.2, 250/492.3

See application file for complete search history.

(56) References Cited

U.S. PATENT DOCUMENTS

| | | | | |
|---|---|---|---|---|
| 4,705,956 A | * | 11/1987 | Ward ........................ | 250/492.2 |
| 4,902,898 A | * | 2/1990 | Jones et al. .............. | 250/492.2 |
| 5,583,344 A | * | 12/1996 | Mizumura et al. ...... | 250/492.21 |
| 6,770,402 B1 | * | 8/2004 | Suguro et al. .................. | 430/5 |

FOREIGN PATENT DOCUMENTS

JP          2002-182000          6/2002

\* cited by examiner

*Primary Examiner*—John R. Lee
*Assistant Examiner*—Jennifer Yantomo
(74) *Attorney, Agent, or Firm*—Oblon, Spivak, McClelland, Maier & Neustadt, P.C.

(57) ABSTRACT

A surface processing apparatus which enables the electron beam energy to be reduced with a simplified construction. A wafer W as an object to be processed is placed in a processing chamber. The wafer is mounted on a mounting stage inside the processing chamber. An electron beam irradiating device is provided on the processing chamber such as to face the mounting stage and irradiates at least one electron beam toward the wafer. A self-generated electric field generator is provided between the electron beam irradiating device and the mounting stage and generates at least one self-generated electric field.

17 Claims, 4 Drawing Sheets

SURFACE PROCESSING APPARATUS

BACKGROUND OF THE INVENTION

1. Field of the Invention

The present invention relates to a surface processing apparatus that irradiates electron beams onto an object to be processed such as a semiconductor wafer or a glass substrate under a vacuum atmosphere, thus modifying a resist or an insulating film.

2. Description of the Related Art

Conventionally, in the field of semiconductor device manufacturing, lithography processing is carried out in which a circuit pattern is transferred onto a semiconductor wafer W using a resist, and then curing processing is carried out in which the resist is cured, thus increasing the mechanical strength of the resist. The curing of the resist in the curing processing is carried out by modifying the resist through electron beam (EB) irradiation.

Figure 4:
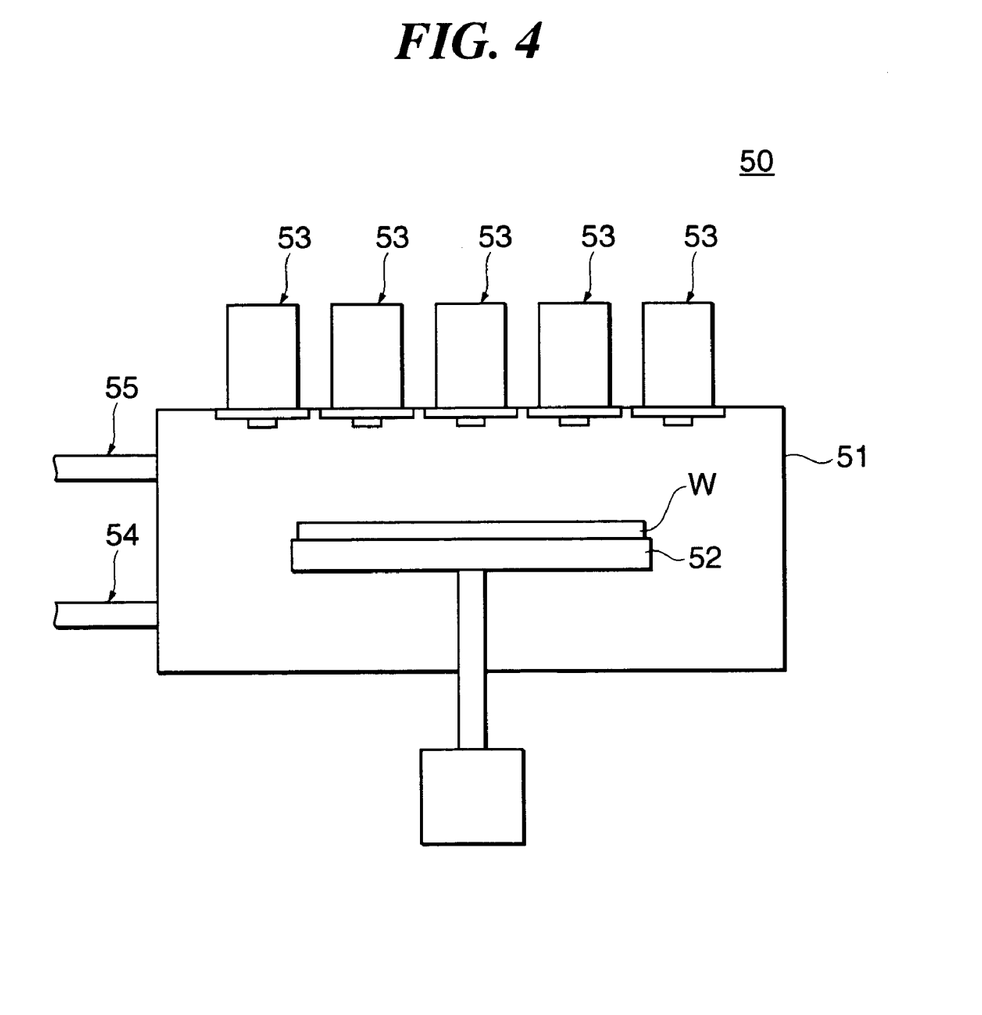
FIG. 4 is a view useful in explaining a conventional electron beam irradiation apparatus used in curing processing.

FIG. 4 is a view useful in explaining a conventional electron beam irradiation apparatus (surface processing apparatus) used in curing processing.

In FIG. 4, the electron beam irradiation apparatus 50 is comprised of a processing chamber 51 inside which a semiconductor wafer W is subjected to curing processing, a mounting stage 52 that is provided in the processing chamber 51 and on which the semiconductor wafer W is mounted, a plurality of electron beam (EB) tubes 53 that are provided in an upper wall of the processing chamber 51 such as to face the mounting stage 52, an exhaust system 54 that controls the pressure inside the processing chamber 51, and a gas introduction port 55 from which a suppressing gas such as nitrogen or a processing gas such as argon for generating ultraviolet radiation is introduced into the processing chamber 51. The semiconductor wafer W is mounted on the mounting stage 52 provided inside the processing chamber 51, and thus faces the EB tubes 53.

Each of the EB tubes 53 is comprised of a cylindrical vacuum vessel, and a cover provided at one end of the vacuum vessel; inside the vacuum vessel are a filament and a grid to both of which a high voltage is applied. Thermal electrons are discharged from the filament that has been heated by the high voltage, the discharged thermal electrons are accelerated by an accelerating voltage generated by the grid to form an electron beam, and the electron beam passes through the cover and is irradiated out of the EB tube 53.

According to the electron beam irradiation apparatus 50, a resist on the semiconductor wafer W is cured through the electron beams from the EB tubes 53 being irradiated onto the resist (see, for example, Japanese Laid-open Patent Publication (Kokai) No. 2002-182000).

In general, resists cured through such curing processing are made of any of various materials and have any of various layer thicknesses, and hence depending on the magnitude of the accelerating voltage, the electron beam energy may be too great for the material and thickness of the resist layer, and hence the electron beams may pass through the resist layer and penetrate into an underlayer below the resist layer in the semiconductor wafer W, whereby the underlayer may be subjected to undesired processing; as a result, the properties of an insulating film, devices or the like provided on the underlayer may change.

Currently, research is thus being carried out into various electron deceleration control methods for subjecting the electrons in an electron beam to deceleration control and thus reducing the electron beam energy.

Of such electron deceleration control methods, a well known method is one in which an intermediate electrode is provided between the EB tubes and the mounting stage, and a predetermined DC voltage is applied to the intermediate electrode, whereby an electric field is generated in a direction such as to decelerate the electrons in the vicinity of the intermediate electrode, and hence the electrons are decelerated.

However, with the method described above in which an intermediate electrode to which a predetermined DC voltage is applied is provided between the EB tubes and the mounting stage, a power source for applying the DC voltage and wiring inside the processing chamber for connecting the power source and the intermediate electrode together are required, and in particular measures must be taken to insulate the wiring inside the processing chamber to prevent abnormal electrical discharge; there is thus a problem that the construction of the surface processing apparatus becomes complex.

SUMMARY OF THE INVENTION

It is an object of the present invention to provide a surface processing apparatus that enables the electron beam energy to be reduced with a simplified construction.

To attain the above object, in the present invention, there is provided a surface processing apparatus comprising a processing chamber inside which an object to be processed is processed, a mounting stage that is provided inside the processing chamber and on which the object to be processed is mounted, an electron beam irradiating device that is provided on the processing chamber such as to face the mounting stage and irradiates at least one electron beam toward the object to be processed, and a self-generated electric field generator that is provided between the electron beam irradiating device and the mounting stage and generates at least one self-generated electric field.

According to the present invention, the surface processing apparatus has a self-generated electric field generator that is provided between the electron beam irradiating device and the mounting stage and generates at least one self-generated electric field. As a result, a Coulomb force due to the at least one self-generated electric field acts on the electrons in the at least one electron beam, and hence the electron beam energy can be reduced by the Coulomb force.

Preferably, the self-generated electric field generator comprises at least one member of which at least a facing surface thereof facing the electron beam irradiating device is electrically floating.

According to the present invention, the self-generated electric field generator preferably comprises at least one member of which at least a facing surface thereof facing the electron beam irradiating device is electrically floating (insulated). As a result, charge is accumulated on the at least one member, and hence at least one self-generated electric field is generated through the accumulated charge. There is thus no need to apply a voltage to the self-generated electric field generator, and hence the construction of the surface processing apparatus can be simplified.

Preferably, the self-generated electric field generator has at least one electron passing hole formed in a facing surface thereof facing the electron beam irradiating device.

According to the present invention, the self-generated electric field generator preferably has at least one electron passing hole in a facing surface thereof facing the electron beam irradiating device. As a result, the at least one electron beam can be converged by the self-generated electric field generated in the electron passing hole, and hence the efficiency of surface processing such as curing processing can be improved.

More preferably, an aperture ratio of the at least one electron passing hole in the facing surface is not less than 50%.

According to the present invention, the aperture ratio of the at least one electron passing hole in the facing surface is more preferably not less than 50%. As a result, the electron beam irradiation amount can be controlled physically, and thus the electron beam energy reaching the object to be processed can be reduced.

Still more preferably, the aperture ratio is not less than 80%.

According to the present invention, the aperture ratio of the at least one electron passing hole in the facing surface is still more preferably not less than 80%. As a result, the electron beam energy reaching the object to be processed can be reduced to an extent that the efficiency of the surface processing is not reduced.

More preferably, the self-generated electric field generator comprises at least one plate-shaped object, and the at least one electron passing hole is a slit.

According to the present invention, more preferably, the self-generated electric field generator comprises at least one plate-shaped object, and the at least one electron passing hole is a slit. As a result, the self-generated electric field generator can be formed easily, and hence the construction of the surface processing apparatus can be further simplified.

Alternatively, the self-generated electric field generator comprises at least one mesh-like object.

According to the present invention, the self-generated electric field generator alternatively comprises at least one mesh-like object. As a result, the distribution of the at least one electron beam passing through the self-generated electric field generator can be made uniform.

Preferably, the self-generated electric field generator comprises at least one member comprising an inner member that is made of a conductive material and an outer member that is made of an insulating material and covers the inner member.

According to the present invention, the self-generated electric field generator preferably comprises at least one member comprising an inner member that is made of a conductive material and an outer member that is made of an insulating material and covers the inner member. As a result, a capacitor having the outer member as a dielectric material therein can be formed. A self-generated electric field can thus be generated by charge accumulated on the dielectric material, and hence the electron beam energy can be reduced reliably, and moreover the construction of the surface processing apparatus can be reliably simplified.

More preferably, the at least one member of the self-generated electric field generator has a lead wire that grounds the inner member.

According to the present invention, the at least one member of the self-generated electric field generator more preferably has a lead wire that grounds the inner member. As a result, the potential at the electrodes in the capacitor described above can be kept constant. The amount of charge accumulated on the dielectric material can thus be kept constant, and hence the electron beam energy can be stably reduced.

Still more preferably, the lead wire has a capacitor therein.

According to the present invention, the lead wire still more preferably has a capacitor therein. As a result, the amount of charge accumulated on the dielectric material can be changed as appropriate. Changes in curing processing conditions can thus easily be coped with.

More preferably, the inner member is electrically floating.

According to the present invention, the inner member may be electrically floating. As a result, the lead wire becomes unnecessary, and hence the structure of the self-generated electric field generator can be reliably simplified.

More preferably, the conductive material is one selected from the group consisting of silicon, aluminum, iron, stainless steel, carbon, silicon carbide, and copper.

According to the present invention, the conductive material is more preferably one selected from the group consisting of silicon, aluminum, iron, stainless steel, carbon, silicon carbide, and copper. As a result, the conductive material can be easily procured, and hence the cost of the surface processing apparatus can be reduced.

More preferably, the insulating material is an oxide of the conductive material.

According to the present invention, the insulating material is more preferably an oxide of the conductive material. As a result, the insulating material can be easily produced, and hence the cost of the surface processing apparatus can be reduced.

Alternatively, the self-generated electric field generator comprises at least one member that is made of only an insulating material.

According to the present invention, the self-generated electric field generator alternatively comprises at least one member that is made of only an insulating material. As a result, the self-generated electric field generator can accumulate charge. At least one self-generated electric field can thus be generated through the accumulated charge, and hence the electron beam energy can be reduced reliably, and moreover the construction of the surface processing apparatus can be reliably simplified.

Preferably, the insulating material is one selected from the group consisting of alumina, silica, and quartz.

According to the present invention, the insulating material is preferably one selected from the group consisting of alumina, silica, and quartz. As a result, the insulating material can be easily procured, and hence the cost of the surface processing apparatus can be reduced.

Alternatively, the self-generated electric field generator comprises at least one electrically floating member that is made of only a conductive material.

According to the present invention, the self-generated electric field generator alternatively comprises at least one electrically floating member that is made of only a conductive material. As a result, charge put onto the conductive material can be made to stay on the conductive material, and hence at least one self-generated electric field can be generated through this charge. The electron beam energy can thus be reduced reliably, and moreover the construction of the surface processing apparatus can be reliably simplified.

Preferably, the conductive material is one selected from the group consisting of silicon, aluminum, iron, stainless steel, carbon, silicon carbide, and copper.

According to the present invention, the conductive material is preferably one selected from the group consisting of silicon, aluminum, iron, stainless steel, carbon, silicon carbide, and copper. As a result, the conductive material can be easily procured, and hence the cost of the surface processing apparatus can be reduced.

The above and other objects, features, and advantages of the invention will become more apparent from the following detailed description taken in conjunction with the accompanying drawings.

DETAILED DESCRIPTION OF THE PREFERRED EMBODIMENTS

The present invention will now be described with reference to the drawings showing preferred embodiments thereof.

Figure 1:
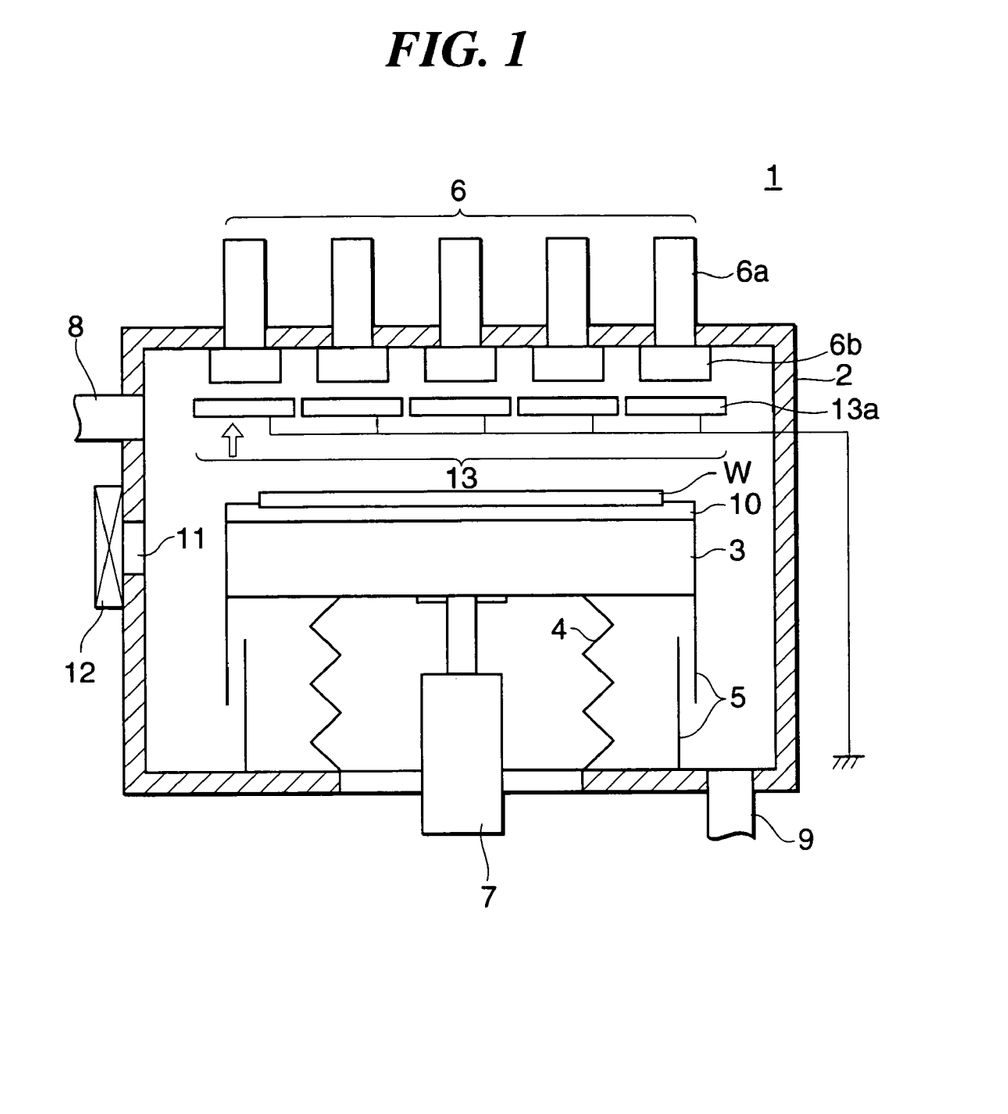
FIG. 1 is a schematic view showing the construction of a surface processing apparatus according to a first embodiment of the present invention.

FIG. 1 is a schematic view showing the construction of a surface processing apparatus according to a first embodiment of the present invention. The surface processing apparatus carries out curing processing (surface processing) in which electron beams are irradiated onto an object to be processed, i.e. a semiconductor wafer W or the like, thus increasing the mechanical strength of a resist on the object to be processed.

As shown in FIG. 1, the surface processing apparatus 1 is comprised of a cylindrical vacuum chamber (processing chamber) 2 that is made, for example, of aluminum or the like, and is constructed such that the interior thereof can be hermetically sealed, a mounting stage 3 that is provided inside the vacuum chamber 2 and has the semiconductor wafer W mounted generally horizontally thereon with a surface to be processed of the semiconductor wafer W facing upward in FIG. 1, a cylindrical bellows 4 that is provided below the mounting stage 3, is made, for example, of stainless steel (SUS), and is constructed such as to be freely extendible/contractible and such as to maintain the interior of the vacuum chamber 2 in a hermetic state, a bellows cover 5 provided outside the bellows 4, and an electron beam irradiating device 6 that is provided on a ceiling portion of the vacuum chamber 2 and irradiates electron beams onto the semiconductor wafer W mounted on the mounting stage 3.

The electron beam irradiating device 6 is comprised of a plurality of electron beam tubes (EB tubes) 6a arranged in an array, and irradiation windows 6b that are arranged in one-to-one correspondence with the EB tubes 6a, each irradiation window 6b being disposed at a tip of the corresponding EB tube 6a. In the surface processing apparatus 1, a total of nineteen EB tubes 6a are provided such as to occupy a circular region of approximately the same shape as the semiconductor wafer W mounted on the mounting stage 3.

Each of the electron beams emitted from the electron beam irradiating device 6 becomes a stream of electrons that radiates out due to repeated scattering of the electrons caused by the electrons repeatedly colliding with inert molecules in a processing space inside the vacuum chamber 2; "electron beam" in the present embodiment refers to such a stream of electrons.

The mounting stage 3 is constructed such as to be movable up and down by a raising/lowering device 7 comprised, for example, of a ball screw and a motor that rotates the ball screw; the distance between the electron beam irradiating device 6 and the semiconductor wafer W is adjusted using the raising/lowering device 7 when the electron beam irradiation is carried out.

A gas introduction pipe 8 that is connected to a gas supply source, not shown, and an exhaust pipe 9 that is connected to a vacuum exhauster, not shown, are provided in the vacuum chamber 2; the inside of the vacuum chamber 2 can thus be made to be a predetermined gas atmosphere at a predetermined degree of vacuum.

Moreover, a heater 10 is provided on a semiconductor wafer W mounting surface of the mounting stage 3, whereby the semiconductor wafer W is heated to a predetermined temperature. Furthermore, an opening 11 for conveying semiconductor wafers W in and out is disposed in a side wall portion of the vacuum chamber 2, and moreover a gate valve 12 is disposed in the opening 11; semiconductor wafers W are conveyed in and out via the opening 11 by opening and closing the gate valve 12.

Furthermore, in the surface processing apparatus 1, a self-generated electric field generator 13 is provided between the mounting stage 3 and the electron beam irradiating device 6, for controlling the electron beam energy.

The self-generated electric field generator 13 is comprised of a plurality of charging plates 13a disposed such that each of the charging plates 13a faces one of the irradiation windows 6b; in the surface processing apparatus 1, as mentioned earlier, nineteen EB tubes 6a are provided, and hence the self-generated electric field generator 13 has nineteen charging plates 13a. Here, the distance between the mounting stage 3 and the electron beam irradiating device 6 is, for example, 100 mm, whereas the distance between each charging plate 13a and the corresponding irradiation window 6b is, for example, 10 mm.

Figure 2A:
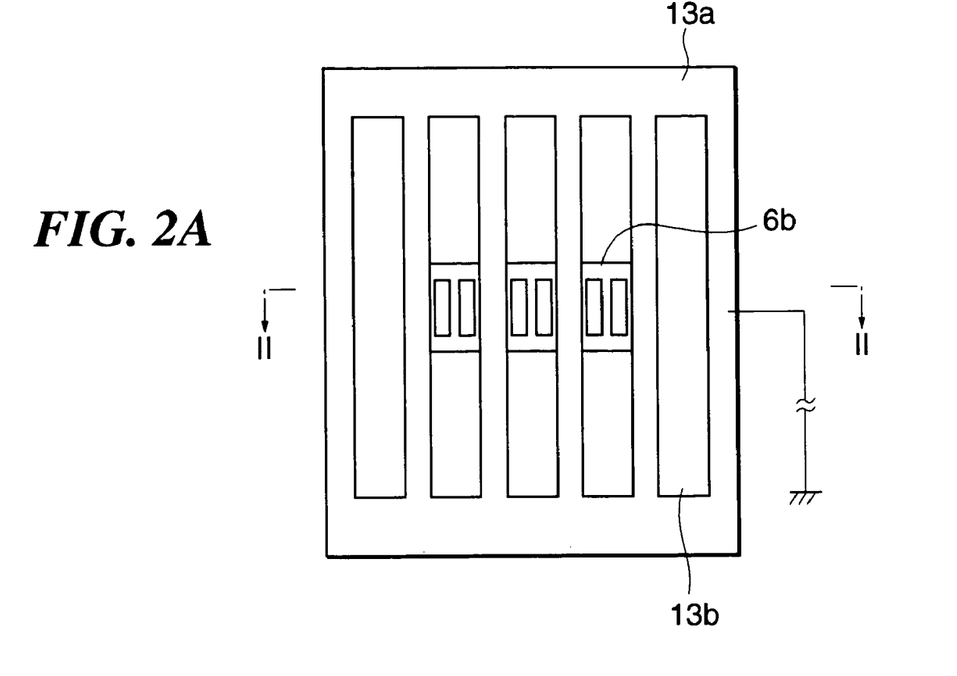
FIG. 2A is a schematic view showing the construction of a charging plate as viewed from the direction of the arrow in FIG. 1.
Figure 2B:
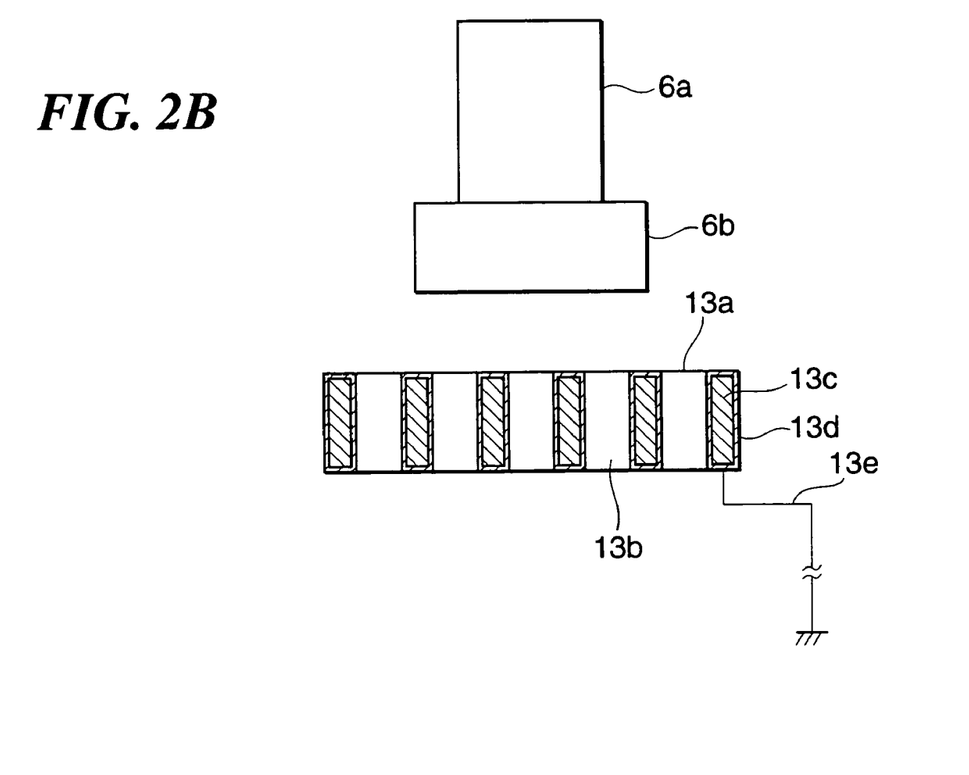
FIG. 2B is a sectional view taken along line II—II in FIG. 2A.

FIG. 2A is a schematic view showing the construction of one of the charging plates as viewed from the direction of the arrow in FIG. 1, and FIG. 2B is a sectional view taken along line II—II in FIG. 2A.

In FIGS. 2A and 2B, the charging plate 13a is a plate-shaped object, and has formed therein at a facing surface thereof facing the corresponding irradiation window 6b, five slits (electron passing holes) 13b through which the electron beam from the corresponding EB tube 6a passes. The ratio of the total opening area of the five slits 13b to the area of the facing surface (i.e. the aperture ratio) is, for example, not less than 50%, preferably not less than 80%.

Moreover, the charging plate 13a has an inner member 13c that is made of a conductive material, an outer member 13d that is made of an insulating material and covers the inner member 13c, and a lead wire 13e that grounds the inner member 13c.

In each charging plate 13a, the conductive material constituting the inner member 13c is aluminum, and the insulating material constituting the outer member 13d is alumina ($Al_2O_3$); the thickness of the outer member 13d is, for example, 0.6 μm.

When the semiconductor wafer W is subjected to curing processing using the surface processing apparatus 1, a plasma is produced from a processing gas introduced into the vacuum chamber 2 from the gas introduction pipe 8; at this time, a capacitor is formed from each of the charging plates 13a, wherein the plasma and the inner member 13c act as two electrodes, and the outer member 13d acts as a dielectric material between the two electrodes.

When the electron beams are irradiated from the electron beam irradiating device 6 toward the semiconductor wafer W, for each of the charging plates 13a, charge is accumulated on the outer member 13d, which acts as the dielectric material of the capacitor, through the stream of electrons in the electron beam, and hence a self-generated electric field is generated in the vicinity of the charging plate 13a by the accumulated charge. The self-generated electric field is oriented toward the electron beam irradiating device 6, and hence a Coulomb force that acts in a direction such as to decelerate the electrons in the electron beam is generated, and thus the electron beam energy is reduced by the Coulomb force.

At this time, the positive potential of the plasma relative to the surface of the outer member 13d is constant, and moreover the inner member 13c is grounded by the lead wire 13e, and hence the amount of charge on the outer member 13d is constant.

According to the surface processing apparatus of the first embodiment, the surface processing apparatus has a self-generated electric field generator 13 that is provided between the electron beam irradiating device 6 and the mounting stage 3 and is comprised of a plurality of charging plates 13a each of which has an inner member 13c that is made of a conductive material and an outer member 13d that is made of an insulating material and covers the inner member 13c. As a result, a capacitor can be formed from each of the charging plates 13a, wherein the plasma inside the vacuum chamber 2 and the inner member 13c act as two electrodes, and the outer member 13d acts as a dielectric material between the two electrodes, and hence charge is accumulated on the outer member 13d, whereby each of the charging plates 13a of the self-generated electric field generator 13 can generate a self-generated electric field without the need to apply a voltage. The generated self-generated electric field gives rise to a Coulomb force on the electrons in each of the electron beams, and hence the electron beam energy can be reduced by the Coulomb force. As a result, the electron beam energy can be reduced reliably, and moreover the construction of the surface processing apparatus 1 can be reliably simplified.

Moreover, the charging plates 13a each have a lead wire 13e that grounds the inner member 13c. As a result, the potential at the electrodes in each of the capacitors described above can be kept constant. The amount of charge accumulated on the dielectric material can thus be kept constant, and hence the electron beam energy can be stably reduced.

In general, when an electron beam is emitted into a gas, the stream of electrons undergoes scattering, and hence the amount of the electron beam irradiated onto the semiconductor wafer W is reduced, and thus the efficiency of the surface processing in the curing processing or the like carried out on the semiconductor wafer W drops. However, according to the surface processing apparatus 1 described above, each of the charging plates 13a has slits 13b, and hence a self-generated electric field is generated inside the slits 13b by the charge accumulated on the outer member 13d. This self-generated electric field is able to converge the stream of electrons passing through each of the slits 13b, and hence the efficiency of the surface processing in the curing processing or the like carried out on the semiconductor wafer W can be improved.

Moreover, according to the surface processing apparatus of the first embodiment, each of the charging plates 13a is comprised of only a plate-shaped object having slits. As a result, the self-generated electric field generator 13 can be easily formed, and thus the construction of the surface processing apparatus 1 can be further simplified.

For each of the charging plates 13a, the aperture ratio of the slits 13b in the facing surface facing the irradiation window 6b is not less than 50%. As a result, the electron beam irradiation amount can be physically controlled, and thus the electron beam energy reaching the semiconductor wafer can be reduced.

Moreover, the above aperture ratio is preferably made to be not less than 80%. As a result, the majority of each electron beam can be made to pass through the slits while reducing the energy of the electron beam, and passage of the remainder of the electron beam can be physically prevented. The electron beam energy reaching the semiconductor wafer W can thus be reduced to an extent that the efficiency of the surface processing is not reduced.

Moreover, according to the surface processing apparatus 1 described above, each of the charging plates 13a is provided at a distance of 10 mm from the corresponding irradiation window 6b, i.e. close to the corresponding irradiation window 6b. The reason for this is that the strength of the electric field generated by the charge on the outer member 13d at a particular position is inversely proportional to the square of the distance from this position to the outer member 13d, and hence to efficiently reduce the electron beam energy, it is preferable to provide each of the charging plates 13a close to the corresponding irradiation window 6b.

In the surface processing apparatus 1 described above, only the self-generated electric field generator 13 is provided as a mechanism for controlling the electron beam energy. However, in addition to this, for example, an internal electrode connected to a DC power source may be provided inside the mounting stage 3, whereby an electric field is generated through a DC voltage applied to the internal electrode, and hence the electron beam energy can be reduced more efficiently through a combination of this electric field and the effect of the self-generated electric field generator 13.

In the surface processing apparatus 1 described above, the conductive material of each inner member 13c is aluminum, and the insulating material of each outer member 13d is alumina. However, the conductive material may be silicon, copper or the like, and the insulating material may be silica ($SiO_2$). As a result, the conductive material and the insulating material can be easily procured, and hence the cost of the surface processing apparatus 1 can be reduced. Furthermore, the insulating material may be an oxide of the conductive material, whereby the insulating material can easily be produced, and hence the cost of the surface processing apparatus 1 can be further reduced.

Moreover, in the surface processing apparatus 1 described above, the self-generated electric field generator 13 is comprised of plate-shaped charging plates 13a. However, the self-generated electric field generator 13 may be comprised of mesh-like charging plates, whereby the distribution of the electron beams passing through the self-generated electric field generator 13 can be made uniform.

Furthermore, in the surface processing apparatus 1 described above, the self-generated electric field generator 13 is comprised of a plurality of charging plates 13a disposed such that each of the charging plates 13a faces one of the irradiation windows 6b. However, the self-generated electric field generator 13 may be comprised of a single charging plate covering the region faced by the nineteen irradiation windows 6b, whereby the construction of the self-generated electric field generator 13 can be further simplified.

Moreover, in the surface processing apparatus 1 described above, the inner member 13c of each of the charging plates 13a is at a ground potential (reference potential). However, the lead wire 13e may have a capacitor therein, whereby the potential of the inner member 13c can be changed as desired, and hence the amount of charge accumulated on the outer member 13d can be changed as appropriate, and thus changes in the curing processing conditions can easily be coped with.

Furthermore, the inner member 13c may be electrically floating, whereby the lead wire 13e becomes unnecessary, and hence the structure of the self-generated electric field generator 13 can be simplified reliably.

Next, a surface processing apparatus according to a second embodiment of the present invention will be described in detail.

Figure 3:
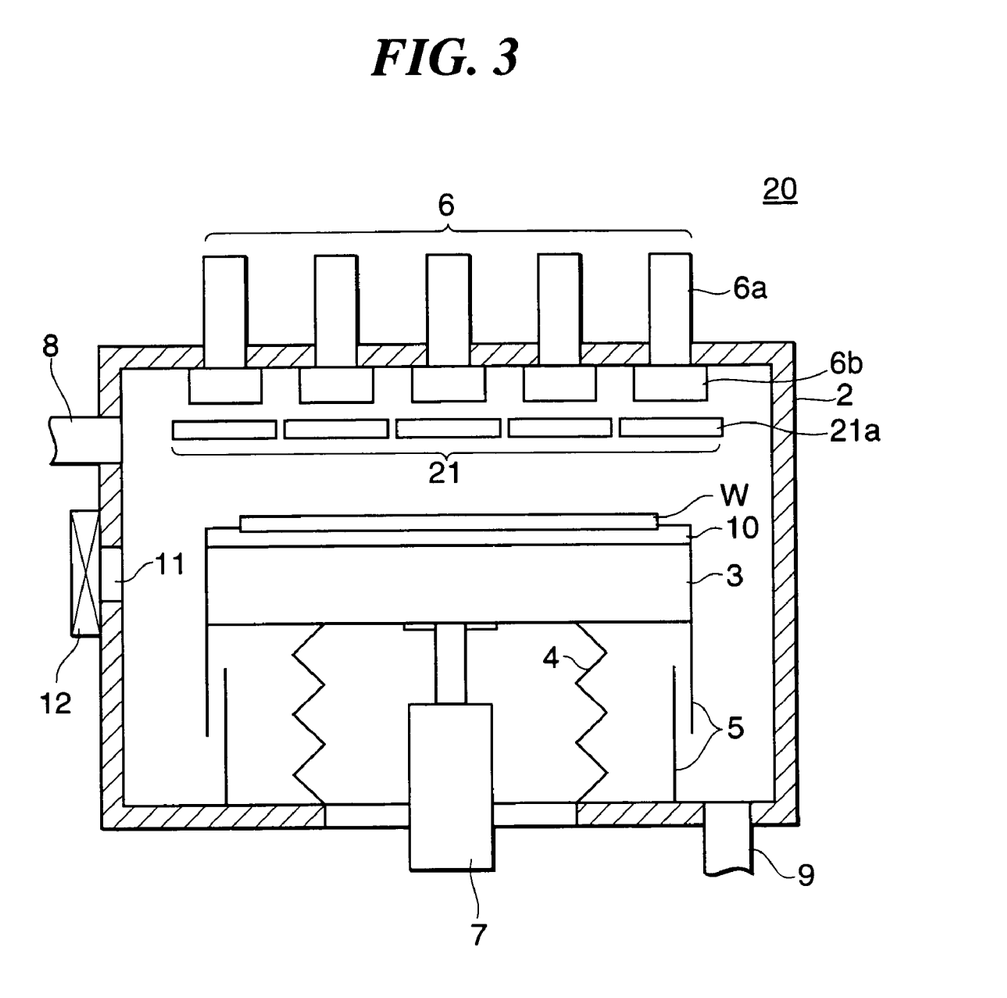
FIG. 3 is a schematic view showing the construction of a surface processing apparatus according to a second embodiment of the present invention.

FIG. 3 is a schematic view showing the construction of the surface processing apparatus according to the second embodiment of the present invention.

The surface processing apparatus according to the second embodiment has basically the same construction and operation as in the first embodiment described above, and hence description of aspects of the construction and operation that overlap with the first embodiment will be omitted, and in the following only aspects of the construction and operation that differ to the first embodiment will be described.

In FIG. 3, in the surface processing apparatus 20 according to the present embodiment, a self-generated electric field generator 21 is provided between the mounting stage 3 and the electron beam irradiating device 6, for controlling the electron beam energy.

The self-generated electric field generator 21 has the same form as and is provided in the same position as the self-generated electric field generator 13 in the surface processing apparatus 1 according to the first embodiment, but the construction of the charging plates 21a is different; specifically, each of the charging plates 21a in the self-generated electric field generator 21 is made of only an insulating material, for example alumina.

According to the surface processing apparatus 20, when the electron beams are irradiated from the electron beam irradiating device 6 toward the semiconductor wafer W, for each of the charging plates 21a, because the charging plate 21a is insulated from ground, charge is accumulated on the charging plate 21a through the stream of electrons in the electron beam, and hence a self-generated electric field is generated in the vicinity of the charging plate 21a by the accumulated charge. The self-generated electric field is oriented toward the electron beam irradiating device 6, and hence a Coulomb force that acts in a direction such as to decelerate the electrons in the electron beam is generated, and thus the electron beam energy is reduced by the Coulomb force.

According to the surface processing apparatus of the present embodiment, the surface processing apparatus has a self-generated electric field generator 21 that is provided between the electron beam irradiating device 6 and the mounting stage 3 and has charging plates 21a that are made of only an insulating material. As a result, charge can be accumulated on the charging plates 21a. The surface processing apparatus 20 can thus generate a self-generated electric field through the charge accumulated on each of the charging plates 21a, and hence the electron beam energy can be reduced reliably, and moreover the construction of the surface processing apparatus 20 can be reliably simplified.

In the surface processing apparatus 20 described above, the insulating material of the charging plates 21a is alumina. However, the insulating material may be silica ($SiO_2$). As a result, the insulating material can be easily procured, and hence the cost of the surface processing apparatus 20 can be reduced.

Moreover, in the present embodiment described above, an example in which the charging plates 21a are made of only an insulating material was described. However, for each of the charging plates 21a, a construction may be adopted in which at least a facing surface of the charging plate 21a facing the electron beam irradiating device 6 is made of an insulating material, and, for example, a portion of the charging plate 21a other than the facing surface is made of a conductive material. As a result, in the surface processing apparatus 20, a self-generated electric field oriented toward the electron beam irradiating device 6 can be generated through charge being accumulated on the facing surface of each of the charging plates 21a. The electron beam energy can thus be reliably reduced, and moreover the construction of the surface processing apparatus 20 can be reliably simplified.

A surface processing apparatus according to a third embodiment of the present invention will now be described in detail.

The surface processing apparatus according to the third embodiment has nearly the same construction and operation as in the second embodiment described above, and hence drawings for the third embodiment will be omitted, and moreover description of aspects of the construction and operation that overlap with the second embodiment will be omitted, and in the following only aspects of the construction and operation that differ to the second embodiment will be described.

The surface processing apparatus according to the present embodiment has a self-generated electric field generator that differs from the self-generated electric field generator 21 in the surface processing apparatus 20 described above only in terms of the construction of the charging plates. Specifically, each of the charging plates in the self-generated electric field generator of the present embodiment is comprised of an electrically floating body made of only a conductive material such as aluminum.

According to the surface processing apparatus of the present embodiment, when the electron beams are irradiated from the electron beam irradiating device 6 toward the semiconductor wafer W, for each of the charging plates, because the charging plate is electrically floating, charge put onto the conductive material through the stream of electrons in the electron beam does not flow out to ground but rather stays on the conductive material, and hence a self-generated electric field is generated in the vicinity of the charging plate by this charge. The self-generated electric field is oriented toward the electron beam irradiating device 6, and hence a Coulomb force that acts in a direction such as to decelerate the electrons in the electron beam is generated, and thus the electron beam energy is reduced by the Coulomb force.

According to the surface processing apparatus of the present embodiment, the surface processing apparatus has a self-generated electric field generator that is provided between the electron beam irradiating device 6 and the mounting stage 3 and has charging plates each of which is comprised of an electrically floating body made of only a conductive material. As a result, charge put onto the conductive material does not flow out to ground but rather stays on the charging plate. The surface processing apparatus can thus generate a self-generated electric field through this charge on each of the charging plates, and hence the electron beam energy can be reduced reliably, and moreover the construction of the surface processing apparatus can be reliably simplified.

In the surface processing apparatus according to the present embodiment described above, the conductive material of the charging plates is aluminum. However, the conductive material may also be any of silicon, iron, stainless steel, carbon, silicon carbide, and copper. As a result, the conductive material can be easily procured, and hence the cost of the surface processing apparatus can be reduced.

Moreover, in the present embodiment described above, an example in which each of the charging plates is comprised of an electrically floating body made of only a conductive material was described. However, for each of the charging plates, a construction may be adopted in which at least a facing surface facing the electron beam irradiating device 6 is comprised of an electrically floating body made of a conductive material, and, for example, a portion of the charging plate other than the facing surface is made of an insulating material or the like. As a result, in the surface processing apparatus, a self-generated electric field oriented toward the electron beam irradiating device 6 can be generated through charge being accumulated on the facing surface of each of the charging plates, and hence the electron beam energy can be reduced reliably, and moreover the construction of the surface processing apparatus can be reliably simplified.

The strength of the self-generated electric field generated by the surface processing apparatus according to each of the first to third embodiments described above is controlled through the distance between the charging plates in the self-generated electric field generator and the irradiation windows 6b, but in the case that the charging plates are wholly or partially made of a dielectric material, can also be controlled through the dielectric constant of the dielectric material.

Moreover, the percentage reduction in the electron beam energy is controlled through the strength of the self-generated electric field, but can also be controlled through the aspect ratio of the slits possessed by the charging plates. In this case, the higher the aspect ratio, the greater the percentage reduction in the electron beam energy. Furthermore, the percentage reduction in the electron beam energy can also be controlled through the aperture ratio of the charging plates; in this case, the lower the aperture ratio, the greater the percentage reduction in the electron beam energy.

According to the surface processing apparatus of each of the first to third embodiments described above, the semiconductor wafer W is subjected to curing processing; however, in the curing processing, not only curing of a resist, but also curing of an SOG (spin-on-glass) film that has been applied onto the semiconductor wafer W may be carried out, whereby an insulating film comprised of the SOG film can be smoothed.

Furthermore, according to the surface processing apparatus of each of the first to third embodiments described above, there is no limitation to surface processing of semiconductor wafers W, but rather surface processing may be carried out on objects other than semiconductor wafers W such as glass substrates for liquid crystal display apparatuses.

What is claimed is:

1. A surface processing apparatus comprising:
   a processing chamber inside which an object to be processed is processed;
   a mounting stage that is provided inside said processing chamber and on which the object to be processed is mounted;
   an electron beam irradiating device that is provided on said processing chamber such as to face said mounting stage and irradiates at least one electron beam toward the object to be processed; and
   a self-generated electric field generator that is provided between said electron beam irradiating device and said mounting stage and generates at least one self-generated electric field such that energy of the at least one electron beam is reduced.

2. A surface processing apparatus as claimed in claim 1, wherein said self-generated electric field generator comprises at least one member of which at least a facing surface thereof facing said electron beam irradiating device is electrically floating.

3. A surface processing apparatus as claimed in claim 1, wherein said self-generated electric field generator has at least one electron passing hole formed in a facing surface thereof facing said electron beam irradiating device.

4. A surface processing apparatus as claimed in claim 3, wherein an aperture ratio of said at least one electron passing hole in said facing surface is not less than 50%.

5. A surface processing apparatus as claimed in claim 4, wherein the aperture ratio is not less than 80%.

6. A surface processing apparatus as claimed in claim 3, wherein said self-generated electric field generator comprises at least one plate-shaped object, and said at least one electron passing hole is a slit.

7. A surface processing apparatus as claimed in claim 3, wherein said self-generated electric field generator comprises at least one mesh-like object.

8. A surface processing apparatus as claimed in claim 1, wherein said self-generated electric field generator comprises at least one member comprising an inner member that is made of a conductive material and an outer member that is made of an insulating material and covers said inner member.

9. A surface processing apparatus as claimed in claim 8, wherein said at least one member of said self-generated electric field generator has a lead wire that grounds said inner member.

10. A surface processing apparatus as claimed in claim 9, wherein said lead wire has a capacitor therein.

11. A surface processing apparatus as claimed in claim 8, wherein said inner member is electrically floating.

12. A surface processing apparatus as claimed in claim 8, wherein said conductive material is one selected from the group consisting of silicon, aluminum, iron, stainless steel, carbon, silicon carbide, and copper.

13. A surface processing apparatus as claimed in claim 8, wherein said insulating material is an oxide of said conductive material.

14. A surface processing apparatus as claimed in claim 1, wherein said self-generated electric field generator comprises at least one member that is made of only an insulating material.

15. A surface processing apparatus as claimed in claim 14, wherein said insulating material is one selected from the group consisting of alumina, silica, and quartz.

16. A surface processing apparatus as claimed in claim 1, wherein said self-generated electric field generator comprises at least one electrically floating member that is made of only a conductive material.

17. A surface processing apparatus as claimed in claim 16, wherein said conductive material is one selected from the group consisting of silicon, aluminum, iron, stainless steel, carbon, silicon carbide, and copper.

* * * * *